United States Patent
Lazer (10) Patent No.: US 10,514,914 B2
(45) Date of Patent: Dec. 24, 2019

(54) METHOD FOR MIN-MAX COMPUTATION IN ASSOCIATIVE MEMORY

(71) Applicant: GSI Technology Inc., Sunnyvale, CA (US)

(72) Inventor: Moshe Lazer, Binyamina (IL)

(73) Assignee: GSI Technology Inc., Sunnyvale, CA (US)

( * ) Notice: Subject to any disclaimer, the term of this patent is extended or adjusted under 35 U.S.C. 154(b) by 58 days.

(21) Appl. No.: 15/688,895

(22) Filed: Aug. 29, 2017

(65) Prior Publication Data

US 2019/0065186 A1     Feb. 28, 2019

(51) Int. Cl.
| | |
|---|---|
| *G06F 9/30* | (2018.01) |
| *G11C 15/04* | (2006.01) |
| *G11C 7/10* | (2006.01) |
| *G06F 12/1027* | (2016.01) |

(52) U.S. Cl.
CPC ...... *G06F 9/30021* (2013.01); *G06F 9/30029* (2013.01); *G11C 7/1006* (2013.01); *G11C 15/04* (2013.01); *G06F 12/1027* (2013.01); *G06F 2212/65* (2013.01)

(58) Field of Classification Search
None
See application file for complete search history.

(56) References Cited

U.S. PATENT DOCUMENTS

| 5,325,501 A * | 6/1994 | Carlstedt ............... G06F 7/483 365/49.18 |
|---|---|---|
| 8,238,173 B2 | 8/2012 | Akerib |
| 9,418,719 B2 | 8/2016 | Akerib |
| 9,558,812 B2 | 1/2017 | Akerib |
| 9,859,005 B2 | 1/2018 | Akerib |
| 2015/0131383 A1 | 5/2015 | Akerib |
| 2015/0200009 A1* | 7/2015 | Akerib ............... G11C 15/046 711/103 |

* cited by examiner

*Primary Examiner* — Michael D. Yaary
(74) *Attorney, Agent, or Firm* — Heidi Brun Associates Ltd.

(57) ABSTRACT

A method for finding an extreme value among a plurality of numbers in an associative memory includes creating a spread-out representation (SOR) for each number of the plurality of numbers, storing each SOR in a column of the associative memory array and performing a horizontal bit-wise Boolean operation on rows of the associative memory array to produce an extreme SOR (ESOR) having the extreme value. A system for finding an extreme value includes an associative memory array to store the plurality of numbers, each number storable in a column; a spread-out representation (SOR) creator to create a SOR for each number of the plurality of numbers and to store each SOR in a column of the associative memory array, and an extreme SOR (ESOR) finder to find an extreme value using a horizontal bit-wise Boolean operation on rows of the associative memory array storing bits of the SORs.

18 Claims, 9 Drawing Sheets

| # | item | Binary representation Nib1 Nib2 Nib3 Nib4 | marker |
|---|---|---|---|
| 1 | 6138 | 0001 0111 1111 1010 | 1 |
| 2 | 2868 | 0000 1011 0011 0100 | 1 |
| 3 | 64390 | 1111 1011 1000 0110 | 1 |
| 4 | 64435 | 1111 1011 1011 0011 | 1 |
| 5 | 50006 | 1100 0011 0101 0110 | 1 |
| 6 | 64192 | 1111 1010 1100 0000 | 1 |

|   | Bin Nib1 | SOR Nib1 | | ESOR | marker | Updated marker |
|---|---|---|---|---|---|---|
| 1 | 0001 | 0000 0000 0000 0011 | ≠ | 1111 1111 1111 1111 | 1 | 0 |
| 2 | 0000 | 0000 0000 0000 0001 | ≠ | 1111 1111 1111 1111 | 1 | 0 |
| 3 | 1111 | 1111 1111 1111 1111 | = | 1111 1111 1111 1111 | 1 | 1 |
| 4 | 1111 | 1111 1111 1111 1111 | = | 1111 1111 1111 1111 | 1 | 1 |
| 5 | 1100 | 0001 1111 1111 1111 | ≠ | 1111 1111 1111 1111 | 1 | 0 |
| 6 | 1111 | 1111 1111 1111 1111 | = | 1111 1111 1111 1111 | 1 | 1 |

1111 1111 1111 1111 — 1125

1200

|   | Bin Nib2 | SOR Nib2 | | ESOR | Marker | Updated marker |
|---|---|---|---|---|---|---|
| 1 | 0111 | | | 0000 1111 1111 1111 | 0 | 0 |
| 2 | 1011 | | | 0000 1111 1111 1111 | 0 | 0 |
| 3 | 1011 | 0000 1111 1111 1111 | = | 0000 1111 1111 1111 | 1 | 1 |
| 4 | 1011 | 0000 1111 1111 1111 | = | 0000 1111 1111 1111 | 1 | 1 |
| 5 | 0011 | | | 0000 1111 1111 1111 | 0 | 0 |
| 6 | 1010 | 0000 0111 1111 1111 | ≠ | 0000 1111 1111 1111 | 1 | 0 |

| | Bin Nib3 | SOR Nib3 | | ESOR | Marker | Updated marker |
|---|---|---|---|---|---|---|
| 1 | 1111 | | | 0000 1111 1111 1111 | 0 | 0 |
| 2 | 0111 | | | 0000 1111 1111 1111 | 0 | 0 |
| 3 | 1000 | 0000 0001 1111 1111 | ≠ | 0000 1111 1111 1111 | 1 | 0 |
| 4 | 1011 | 0000 1111 1111 1111 | = | 0000 1111 1111 1111 | 1 | 1 |
| 5 | 0101 | | | 0000 1111 1111 1111 | 0 | 0 |
| 6 | 1100 | | | 0000 1111 1111 1111 | 0 | 0 |

0000 1111 1111 1111 — 1325

1400

| | Bin Nib4 | SOR Nib4 | | ESOR | Marker | Updated marker |
|---|---|---|---|---|---|---|
| 1 | 1010 | | | 0000 0000 0000 1111 | 0 | 0 |
| 2 | 0100 | | | 0000 0000 0000 1111 | 0 | 0 |
| 3 | 0110 | | | 0000 0000 0000 1111 | 0 | 0 |
| 4 | 0011 | 0000 0000 0000 1111 | = | 0000 0000 0000 1111 | 1 | 1 |
| 5 | 0110 | | | 0000 0000 0000 1111 | 0 | 0 |
| 6 | 0000 | | | 0000 0000 0000 1111 | 0 | 0 |

METHOD FOR MIN-MAX COMPUTATION IN ASSOCIATIVE MEMORY

FIELD OF THE INVENTION

The present invention relates to associative memory generally and to a generally efficient method of finding an extreme value in a large dataset in particular.

BACKGROUND OF THE INVENTION

Finding an extreme value (a maximum or a minimum) in a dataset is a common task. US Patent Publication No. US 2015/0200009, (entitled "MEMORY DEVICE"), published on Jul. 16, 2015, issued as U.S. Pat. No. 9,859,005 on Jan. 2, 2018, filed by the common assignee of the present invention and incorporated herein by reference, describes a method of finding an extreme value in a large dataset in memory devices in a constant time O(1). The computation time is roughly constant, regardless of the dataset size.

The prior art method defined in US Patent Publication No. US 2015/0200009, concurrently operates on one bit of all items in the dataset at a time, starting at the MSB (most significant bit) and ending at the LSB (least significant bit). The computation time of such a method is proportional to the number of bits representing the numbers in the dataset, which may be 16 bits, 32 bits and the like.

SUMMARY OF THE PRESENT INVENTION

There is provided, in accordance with a preferred embodiment of the present invention, a method for finding an extreme value amongst a plurality of numbers in an associative memory. The method includes creating a spread-out representation (SOR) for each number of the plurality of numbers, storing each SOR in a column of the associative memory array, and performing a horizontal bit-wise Boolean operation on rows of the associative memory array to produce an extreme SOR (ESOR) having the extreme value.

Moreover, in accordance with a preferred embodiment of the present invention, the SOR of a number N includes a continuous sequence of zeros followed by a continuous sequence of K ones, where K=N+1.

Still further, in accordance with a preferred embodiment of the present invention, the SOR of a number having a value N includes a continuous sequence of ones followed by a continuous sequence of K zeros, where K=N+1.

Additionally, in accordance with a preferred embodiment of the present invention, the Boolean operation is one of: an OR operation and an AND operation.

Furthermore, in accordance with a preferred embodiment of the present invention, the number is a bit aggregation of a larger multi-bit-number.

Still further, in accordance with a preferred embodiment of the present invention, a first bit aggregation includes most significant bits of the multi-bit number and a last bit aggregation comprises least significant bits of the multi-bit number.

Moreover, in accordance with a preferred embodiment of the present invention, the multi-bit number represents an item from among a plurality of items.

Furthermore, in accordance with a preferred embodiment of the present invention, each of the items is assigned an initial candidacy indication.

Still further, in accordance with a preferred embodiment of the present invention, creating a SOR is only for items having a candidacy indication.

Additionally, in accordance with a preferred embodiment of the present invention, the method also includes comparing the ESOR with each SOR of an item having a candidacy indication to provide a similarity indication which is either equal or unequal; and removing said candidacy indication from each number having an unequal similarity indication.

Moreover, in accordance with a preferred embodiment of the present invention, each larger multi-bit number has a multiplicity of bit aggregations and the method also includes repeating the creating, storing, performing, comparing and removing for each said bit aggregation of the multi-bit number until a last group aggregation, thereby to provide candidacy indications to the extreme numbers only.

There is provided, in accordance with a preferred embodiment of the present invention, a system for finding an extreme value amongst a plurality of numbers, the system includes an associative memory array to store the plurality of numbers, each number storable in a column; a spread-out representation (SOR) creator to create a SOR for each number of the plurality of numbers and to store each SOR in a column of the associative memory array, and an extreme SOR (ESOR) finder to find an extreme value using a horizontal bit-wise Boolean operation on rows of the associative memory array storing bits of the SORs.

Moreover, in accordance with a preferred embodiment of the present invention, the SOR of a number having the value N includes either a continuous sequence of zeros followed by a continuous sequence of K ones, or a continuous sequence of ones followed by a continuous sequence of K zeros, wherein K=N+1.

Furthermore, in accordance with a preferred embodiment of the present invention, the Boolean operation is either an OR operation or an AND operation.

Still further, in accordance with a preferred embodiment of the present invention, the number is a bit aggregation of a larger multi-bit-number.

Additionally, in accordance with a preferred embodiment of the present invention, a first bit aggregation includes most significant bits of the multi-bit number and a last bit aggregation comprises least significant bits of the multi-bit number.

Furthermore, in accordance with a preferred embodiment of the present invention, the multi-bit number represents an item from among a plurality of items.

Still further, in accordance with a preferred embodiment of the present invention, the system also includes a row of the memory array to store an initial candidacy indication for each item stored in a same column as each of the SORs, and an extreme finder to compare the ESOR with each SOR and to remove the candidacy indication from each SOR having a different value from the ESOR.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Applicant has realized that the computation time for finding an extreme value in a large dataset may be further improved, compared to the previous methods, by operating concurrently on several bits (referred as "bit aggregations") at a time. At each step, several bits are inspected at a time, instead of one bit at a time as is done in the methods known in the art. Therefore, the computation may be proportional to the number of aggregations instead of to the number of bits.

The size of the bit aggregation may be configurable. For example, the binary representation of the decimal number X=229 is 11100101, which is an 8-bit binary number. The 8-bit binary number may be split into two bit aggregations of size of 4 (i.e. a nibble). In this case, the number X may be represented by 1110 and 0101.

Each nibble may have one of 16 values, between 0 and 15:
0000→$0 \times 2^3 + 0 \times 2^2 + 0 \times 2^1 + 0 \times 2^0 = 0+0+0+0 = 0$ Example 1
0101→$0 \times 2^3 + 1 \times 2^2 + 0 \times 2^1 + 1 \times 2^0 = 0+4+0+1 = 5$ Example 2
1111→$1 \times 2^3 + 1 \times 2^2 + 1 \times 2^1 + 1 \times 2^0 = 8+4+2+1 = 15$ Example 3

Figure 1:
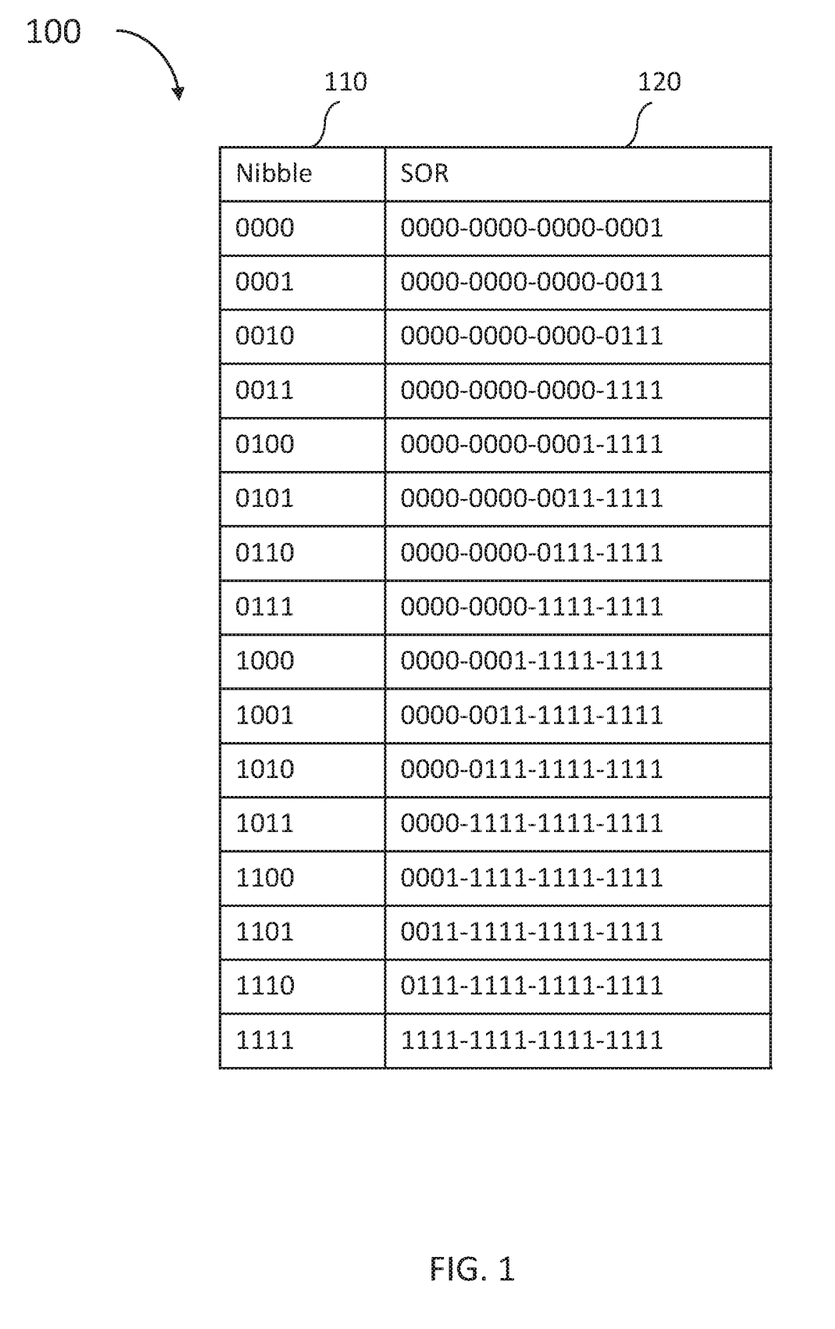
FIG. 1 is an exemplary table of spread-out representations (SORs) of nibbles according to a preferred embodiment of the present invention.

Applicant has realized that each bit aggregation may be represented in a special unary coding, that may provide a quick determination as to which value is extreme (largest or lowest) in a large dataset. This special unary coding is referred herein as a "spread out representation" (SOR). A preferred embodiment of a possible SOR of nibbles is illustrated in FIG. 1, to which reference is now made.

Table 100 provides the possible values of a 4-bit aggregation (nibble) in column 110, and a possible SOR of each value in column 120. The number of bits in a SOR may be equal to the number of possible values of the bit aggregation, and in table 100 the SOR may be represented by 16 bits: $X_{15}X_{14}X_{13}X_{12}X_{11}X_{10}X_9X_8X_7X_6X_5X_4X_3X_2X_1X_0$ ($X_i$=0/1). It may be appreciated that the SOR size of all the SORs in a specific computation may be the same.

In a preferred embodiment of the present invention, the structure of the SOR is such that it is built from a continuous sequence of zeros followed by a continuous sequence of ones where the continuous sequence of ones is not interrupted by a zero in-between and the continuous sequence of zeros is not interrupted by a one in-between. The value K is the location where the sequence of 1s begins, and its value is a number that follows the number represented by the bit aggregation. Specifically, if the value of a bit-aggregation is x, K=x+1.

It may be appreciated that the structure of the SOR may enable the determination of a largest/lowest value of a bit aggregation using simple horizontal Boolean operations (on the bits of a row), such as a single OR operation for finding a maximum value, a single AND operation for finding a minimum value on SORs having the structure defined hereinabove, and the like. It may also be appreciated that in the preferred embodiment, a larger SOR may have more bits with the value 1, providing a larger K, and a smaller SOR has more bits with the value 0. For example, bit aggregation 0110, 0000-0000-0111-1111 (K=7) is larger than bit aggregation 0011-0000-0000-0000-1111 (K=4). It may be appreciated that the original bit aggregation cannot be compared using simple Boolean operations.

The procedure used to create a SOR, having the structure defined hereinabove, from a nibble is described by the following equations. Each equation describes the creation of a bit in the SOR by performing AND and OR Boolean operations on the bits $N_z$ of the nibble.

$X_0 = 1$
$X_1 = ((N_0 + N_1) + N_2) + N_3$
$X_2 = ((N_1) + N_2) + N_3$
$X_3 = ((N_0 \ \& \ N_1) + N_2) + N_3$
$X_4 = N_2 + N_3$
$X_5 = (((N_0 + N_1) \ \& \ N_2) + N_3$
$X_6 = ((N_1) \ \& \ N_2) + N_3$
$X_7 = ((N_0 \ \& \ N_1) \ \& \ N_2) + N_3$
$X_8 = N_3$
$X_9 = ((N_1 + N_1) + N_2) \ \& \ N_3$
$X_{10} = (N_1 + N_2) \ \& \ N_3$
$X_{11} = ((N_0 \ \& \ N_1) + N_2) \ \& \ N_3$
$X_{12} = N_2 \ \& \ N_3$
$X_{13} = (((N_0 + N_1) \ \& \ N_2) \ \& \ N_3$
$X_{14} = ((N_1) \ \& \ N_2) \ \& \ N_3$
$X_{15} = ((N_0 \ \& \ N_1) \ \& \ N_2) \ \& \ N_3$

Where $X_y$ is bit y of SOR 120 and $N_z$ is bit z of the nibble. It may be appreciated that the creation of the SORs of all items may take at most four steps. The most complex SOR computation may include all bits of the nibble, such as, for example, the computation of $X_1$ described hereinabove, which requires all the bits of the nibble. The computation of other bits of the SOR may take three steps, as is the case of $X_2$, two steps as is the case of $X_4$ and one step as is the case of $X_8$.

Figure 2:
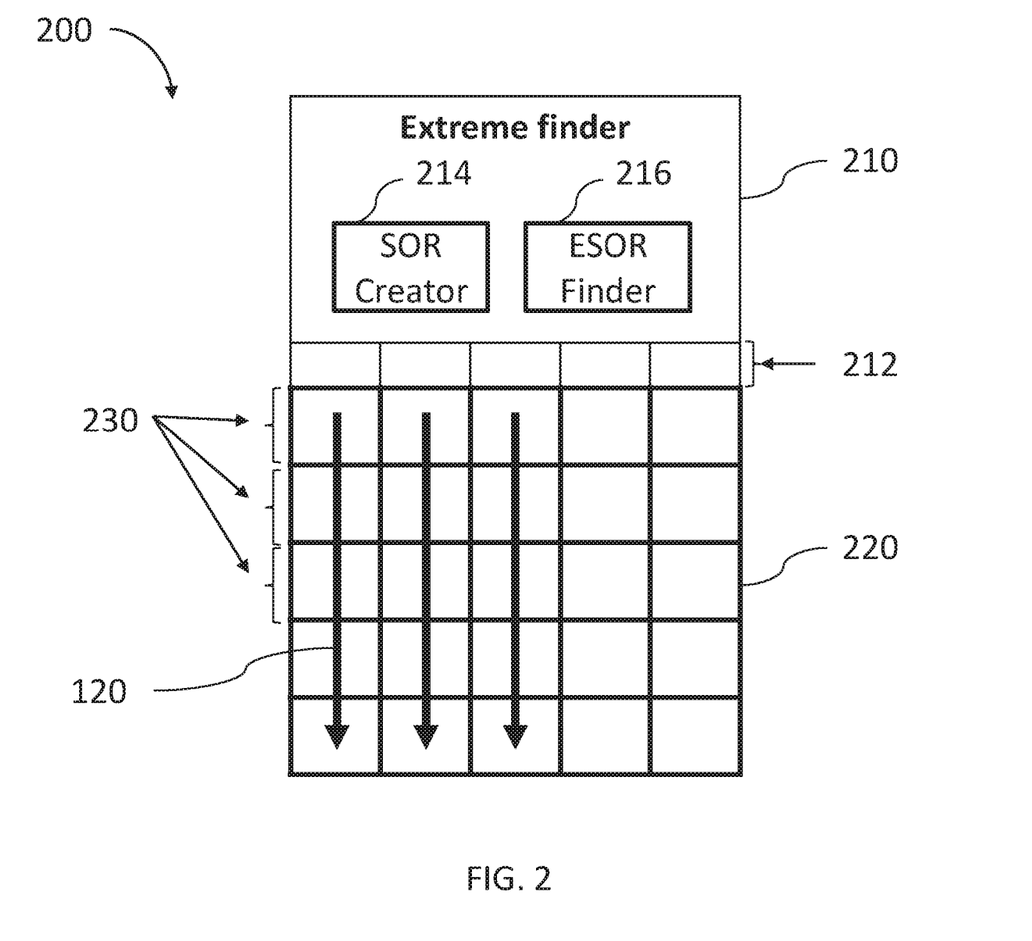
FIG. 2 is a schematic illustration of a memory device constructed and operative in accordance with a preferred embodiment of the present invention.

FIG. 2, to which reference is now made, is a schematic illustration of memory device 200 that comprises an extreme finder 210 and an associative memory array 220. Extreme finder 210 further comprises a marker vector 212 which may provide an indication of all extreme values found in memory array 220, a SOR creator 214 and an ESOR finder 216. Associative memory array 220 may further comprise sections 230.

Associative memory array 220 may be any multi-purpose associative memory devices, such as the ones described in U.S. Pat. No. 8,238,173 (entitled "USING STORAGE CELLS TO PERFORM COMPUTATION") issued on Aug. 7, 2012; US Patent Publication No. US 2015/0131383, (entitled "NON-VOLATILE IN-MEMORY COMPUTING DEVICE"), published on May 14, 2015; U.S. Pat. No. 9,418,719 (entitled "IN-MEMORY COMPUTATIONAL DEVICE") issued on Aug. 16, 2016 and U.S. Pat. No. 9,558,812 (entitled "SRAM MULTI-CELL OPERATIONS") issued on Jan. 31, 2017, all assigned to the common assignee of the present invention and incorporated herein by reference.

Figure 3:
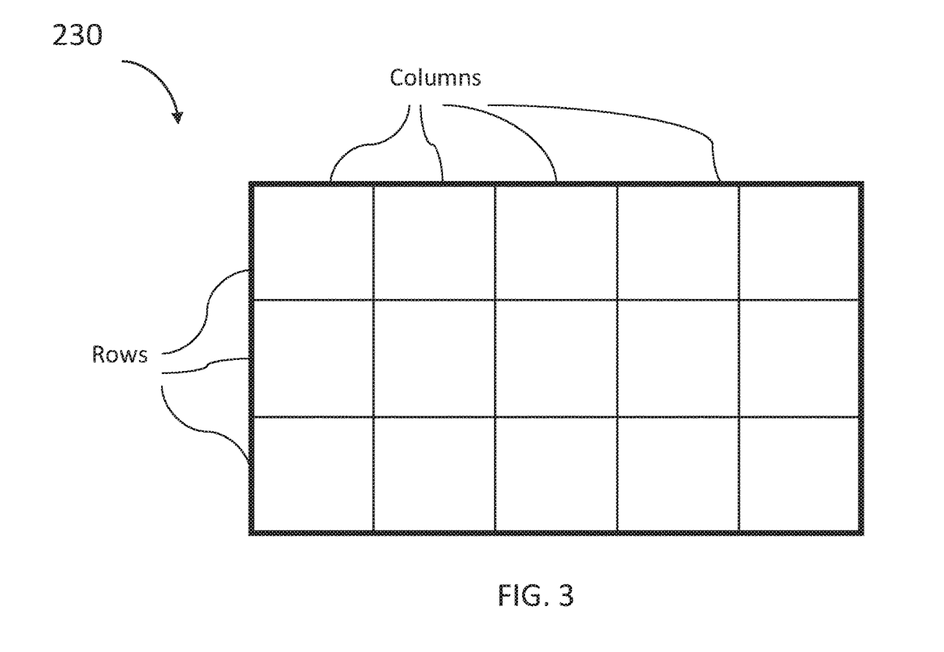
FIG. 3 is a schematic illustration of a section of the memory device of FIG. 2, constructed and operative in accordance with a preferred embodiment of the present invention.

FIG. 3, to which reference is now made, illustrates the structure of a section 230 of associative memory array 220. A section 230 comprises associative memory cells arranged in rows and columns and the entire associative memory array 220 comprises a plurality of sections 230.

Extreme finder 210 may build SORs 120 using the equations described hereinabove, and may store them in memory array 220. Extreme finder 210 may store each SOR 120 in a different column of memory array 220, each bit of SOR 120 in a different section 230. Extreme finder 210 may utilize additional rows of each section 230 to store additional data needed during computation.

FIGS. 4-8 illustrate the basic operations used by extreme finder 210 while operating on data stored in sections 230 of associative memory array 220. Each operation may be a part of the overall method described herein. Some operations may be done horizontally, on data stored in a row of a section; some operations may be done vertically on data stored in a column of a section; and some operations may be done vertically on data stored in a column of several sections. It may be appreciated that both horizontal and vertical operations may be performed concurrently on multiple sections.

Figure 4:
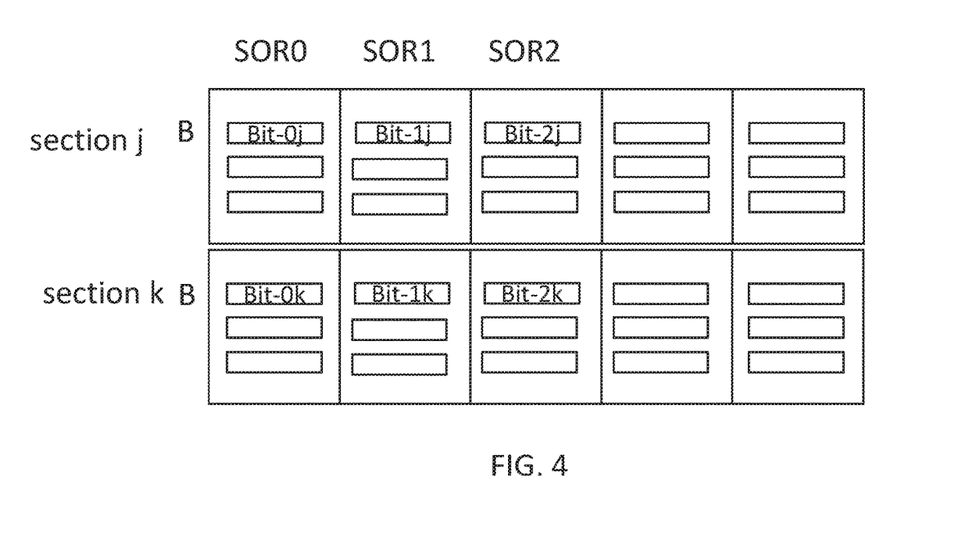
FIG. 4 is a schematic illustration of the data stored in sections of the memory device of FIG. 2, according to a preferred embodiment of the present invention.

FIG. 4, to which reference is now made, illustrates the data stored in sections 230 of associative memory array 220. Extreme finder 210 may store all bits of each SOR in a dedicated column in associative memory array 220, each bit of the SOR in a row B in a section 230. For example, a 16-bit SOR may be stored in rows B of 16 sections. For a larger bit aggregation, a larger SOR may be used.

Extreme finder 210 may store bit j of all SORs in row B of section j. In column SOR-0, extreme finder 210 may store bit j of SOR0, referred as Bit-0j. In column SOR-1, extreme finder 210 may store bit j of SOR1, referred as Bit-1j etc. Generally, extreme finder 210 may store all bits x of all SORs 230 in section x, in a same row B, in a different column SOR-y.

Figure 5:
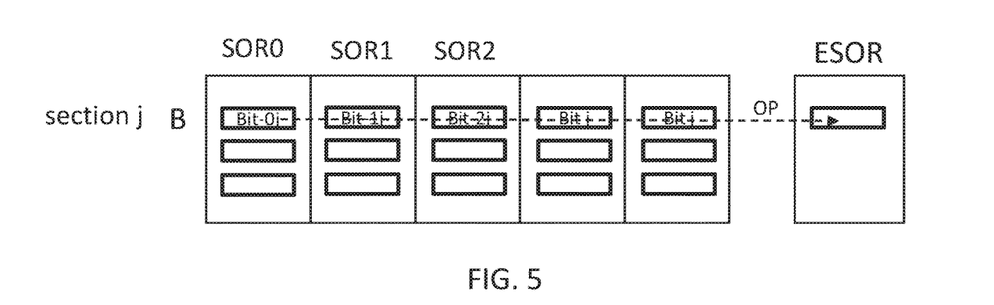
FIG. 5 is a schematic illustration of how an extreme finder forming part of the device of FIG. 2 finds the existence of a value "1" in a row in a section of the memory device, according to a preferred embodiment of the present invention.

FIG. 5 illustrates how extreme finder 210 may find the existence of a value "1" in a row B in a section. Extreme finder 210 may perform a horizontal bitwise OR between all bits j stored in row B of each section, and may store the result of the bitwise OR in a dedicated column of section j, referred to as extreme SOR (ESOR). The horizontal bitwise OR may be performed concurrently on all sections storing bits of SORs. It may be appreciated that a different Boolean operation may apply when using a different structure of the SOR.

It may be appreciated that the largest possible value in a section j is 1 and if at least one of the SORs has the value 1 in section j, the result of the bitwise OR on row B of section j will be 1. ESOR indicates the existence of a 1 in bit j of at least one SOR. Similarly, the lowest possible value in a section j is 0, and if at least one of the SORs has the value 0 in section j, the result of the bitwise AND on row B of section j will be 0.

Figure 6:
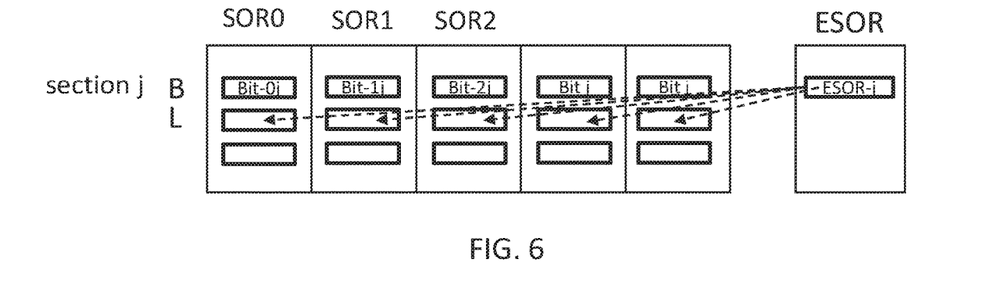
FIG. 6 is a schematic illustration of how the extreme finder of FIG. 5 advertises the ESOR to all SORs, according to a preferred embodiment of the present invention.

FIG. 6 schematically illustrates how extreme finder 210 may advertise the ESOR to all SORs. Extreme finder 210 may write the value of bit j of the ESOR, ESOR-j, to all columns of a row L of section j. It may be appreciated that row L, storing bit j of ESOR, is a different row than row B storing bit j of the SOR. It may be appreciated that the advertisement is done simultaneously to all columns of section j and may be performed concurrently on all sections storing bits of SORs.

Figure 7:
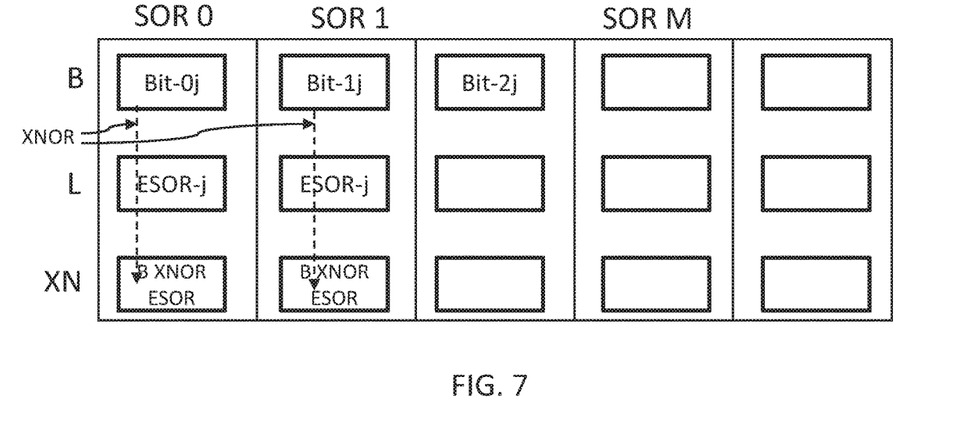
FIG. 7 is a schematic illustration of how the extreme finder of FIG. 5 compares the bits of the SOR to the bits of the ESOR, according to a preferred embodiment of the present invention.

FIG. 7 schematically illustrates how extreme finder 210 may compare the bits of the SOR and the ESOR. Extreme finder 210 may perform bitwise XNOR operations between each bit j of a SOR m stored in row B, Bit-mj, and bit j of ESOR stored in row L, ESOR-j. The result of the XNOR operation may be stored in row XN of section j, different from row B storing Bit-mj and row L storing ESOR-j. It may be appreciated that if the bits are equal, the result of the XNOR will be 1, and if the bits differ, the result of the XNOR will be 0. It may also be appreciated that the XNOR operation may be performed on all sections concurrently, and may provide an indication for each bit of each SOR whether or not the bit Bit-mj equals or differs from ESOR-j.

Figure 8:
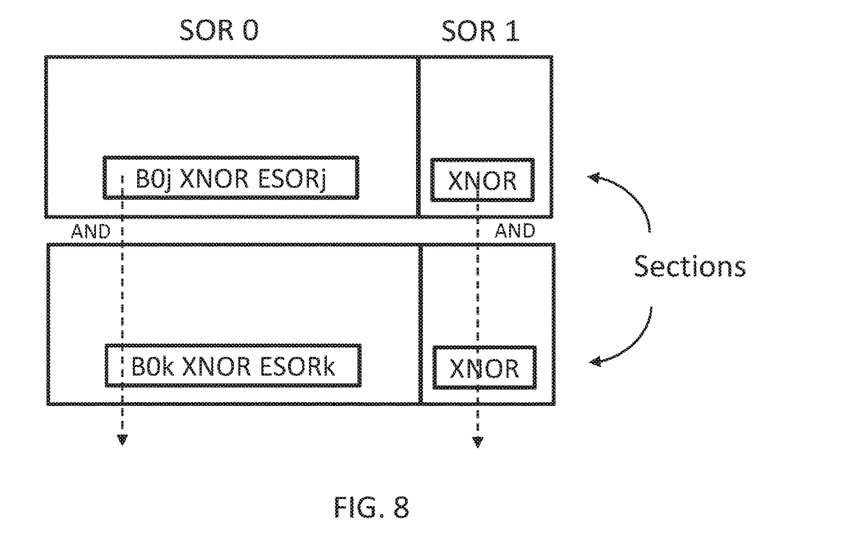
FIG. 8 is a schematic illustration of how extreme finder checks if all bits of a SOR are equal to the bits of the ESOR, according to preferred embodiment of the present invention.

FIG. 8 schematically illustrates how extreme finder 210 may check if all bits of a SOR equal the bits of the ESOR. Only if all bits are equal, the entire SOR equals the entire ESOR. In the previous steps, each bit of the SOR was compared to the relevant bit of the ESOR. In order to determine whether the entire SOR equals ESOR, extreme finder 210 may perform a bitwise AND between the results of the XNOR operation of all sections storing bits of the SORs. The result of the AND operation may provide an indication whether the SOR equals the ESOR—if the value of the bitwise AND is 0, the SOR is different than the ESOR (i.e. smaller), and if the value is 1, then the SOR equals the ESOR.

Figure 9:
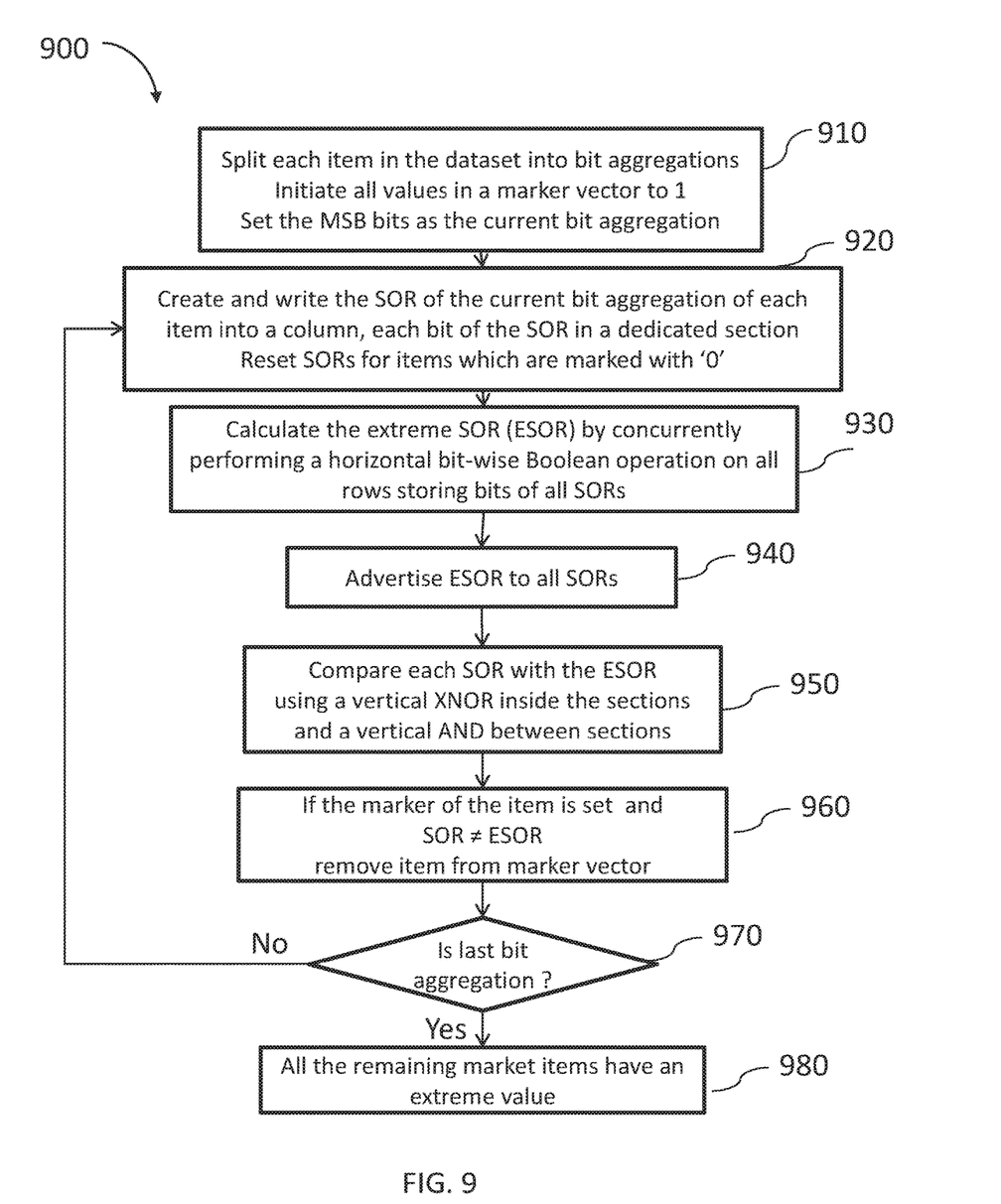
FIG. 9 is a flow chart illustration showing the operations of the extreme finder of FIG. 5 for finding an extreme value in a large dataset, according to a preferred embodiment of the present invention.

FIG. 9 is a flow chart 900 describing the steps that extreme finder 210 may perform for finding an extreme value in a large dataset.

In step 910, extreme finder 210 may split all items in the dataset into bit aggregations, the first bit aggregation having the MSB bits, and the last bit aggregation having the LSB bits. Extreme finder 210 may also initiate the bits of the marker vector to 1, indicating that all items in the dataset are initially candidates for being the maximum.

In step 920, SOR creator 214 may create the SOR of the bit aggregations of each item, as detailed hereinabove, and may write each created SOR into a column of associative memory array 220, each bit of the SOR into a dedicated section as described in FIG. 4.

In step 930, ESOR finder 216 may calculate the largest/lowest SOR (ESOR) by concurrently performing a horizontal bit-wise Boolean operation on all B rows storing bits of all SORs as described in FIG. 5. The Boolean operation may be calculated concurrently on each of the bits of the SORs and the result of the bitwise OR may be the largest or lowest SOR, the ESOR.

In step 940, extreme finder 210 may distribute the ESOR to all SORs as described in FIG. 6. Extreme finder 210 may distribute ESOR j into all columns of a different row of section j. The ESOR may be advertised concurrently to all bits of all SORs.

In step 950, extreme finder 210 may compare each SOR to the ESOR using a vertical XNOR inside each section as described in FIG. 7 and using a vertical AND between sections as described in FIG. 8. If the result of the vertical AND between sections is 1, the SOR equals ESOR.

In step 960, extreme finder 210 may remove candidates from marker vector 212 (of FIG. 2) if the result of the vertical AND, performed in step 940, is 0 indicating that SOR is not equal to ESOR. To remove the candidates, extreme finder 210 may change the values of the bits in the marker of the relevant items to 0.

In step 970, extreme finder 210 may check if the processed bit aggregation was the last bit aggregation. If it is not the last, extreme finder 210 may repeat steps 920 to 960 on the next bit aggregation. If the last bit aggregation was processed, extreme finder 210 may finish the method in step 980 and all the remaining candidates, items having a value 1 in the marker vector, may be items having a maximum value.

Figure 10:
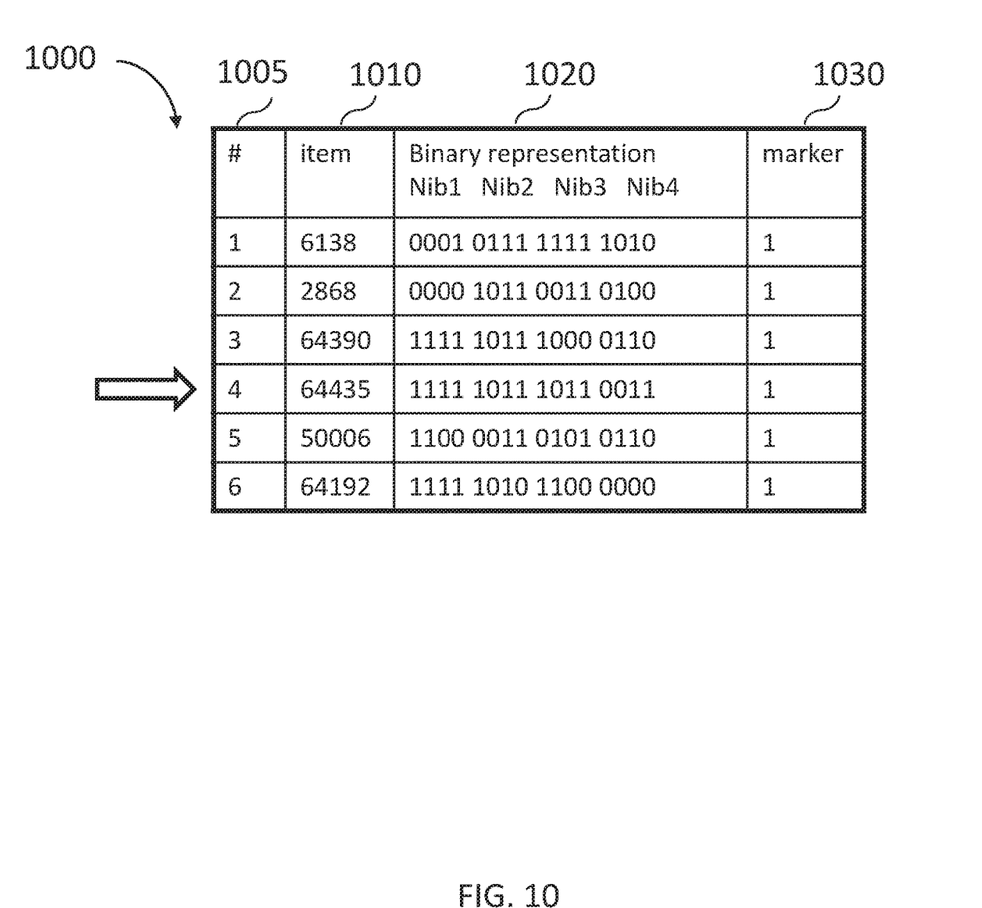
FIG. 10 is a schematic illustration of items of an exemplary dataset, in which the largest value is searched.

FIG. 10, to which reference is now made, provides a table 1000 of items in a simplified exemplary dataset, in which the largest value is searched. Column 1005 is a running index of the items of the dataset to facilitate the explanation. Column 1010 provides the decimal value of the items of the dataset: 6138, 2868, 64390, 64435, 50006 and 64192. It may be appreciated that the largest value in this dataset is item 4 having the value 64435. Column 1020 provides the binary representation of each item where the binary representation is split into nibbles.

Column 1030 provides the initial value of the marker of each item. The markers of all items are first initiated to 1 indicating that each item may potentially have the largest value and is initiated as a candidate. It is expected that at the end of the computation, only the markers of the largest values will remain 1 and all the other values will become 0. In the example, there is only one item with a largest value, but in another case, there may be several items having the largest value. In this case, the markers of all items having the highest value will be 1.

Figure 11:
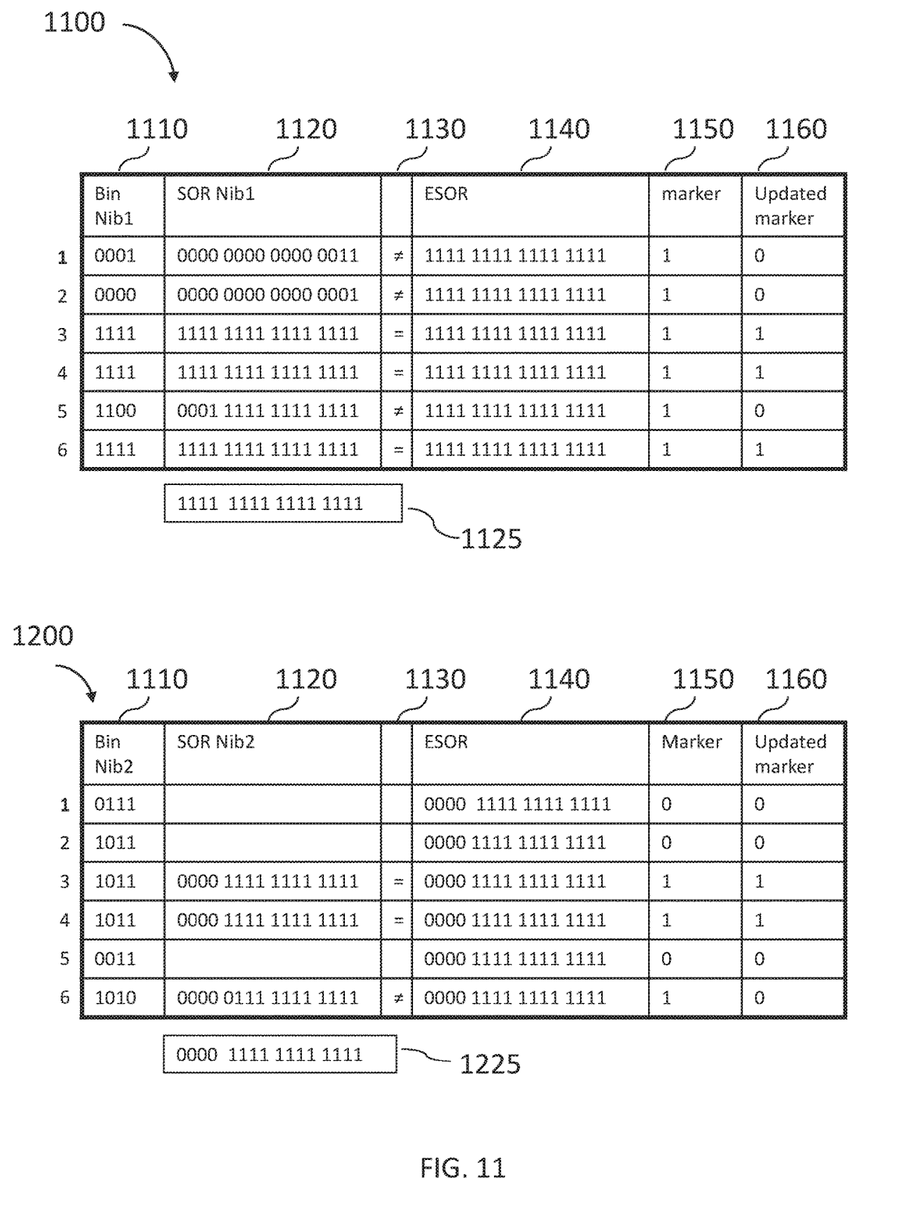
FIGS. 11 and 12 are schematic illustrations of the outcome of employing the flow of FIG. 9 on the exemplary dataset of FIG. 10.
Figure 12:
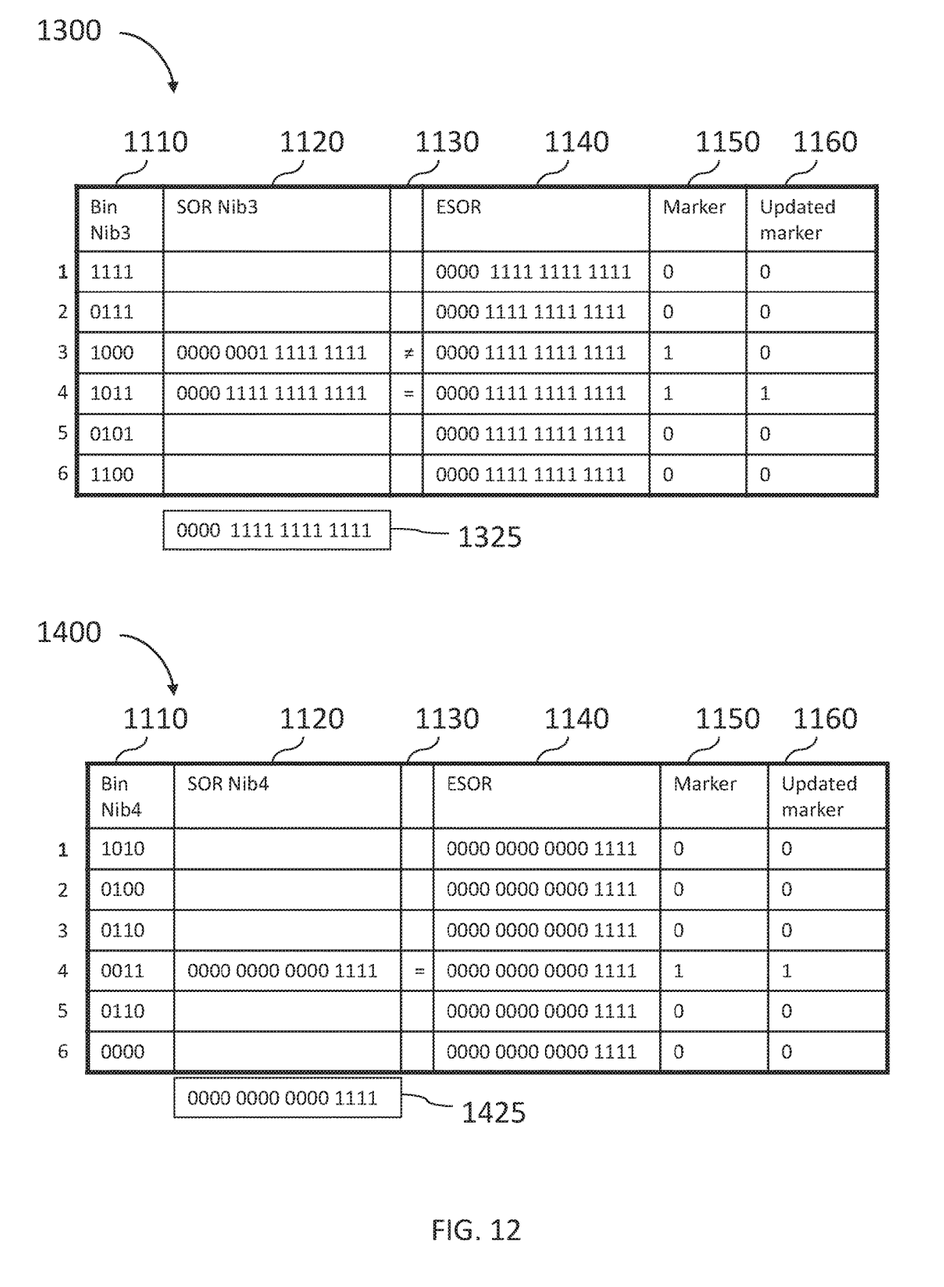

FIGS. 11 and 12, to which reference is now made, provide the outcome of employing flow 900 (of FIG. 9) on the items of table 1000 (of FIG. 10). The input and output of the computation is described by tables. Table 1100 provides the computation details of nibble 1, table 1200 of nibble 2, table 1300 of nibble 3 and table 1400 of nibble 4. The structure of all tables is identical. Column 1110 provides the value of the nibble, column 1120 provides the value of the SOR (step 920 of flow 900 in FIG. 9); Items 1125, 1225, 1325 and 1425 provide the value of the ESOR of each nibble (step 930); column 1140 provides the value of the distributed ESOR (step 940) and column 1130 provides the result of the comparison between the SOR and the ESOR (step 950). Column 1150 provides the value of the marker before the computation of the current nibble started and column 1160 provides the value of the marker after the computation of the current nibble is completed.

It may be appreciated that the value of ESOR 1125, calculated for the first nibble, in table 1100, is 1111-1111-1111-1111 (the result of the bitwise OR between all items in the table). The ESOR is distributed to column 1140 of each item in table 1100. The comparison between the SOR and the ESOR results in three SORs that differ from the ESOR, items 1,2 and 5 which are subsequently removed from the marker vector before starting on the second nibble.

Similarly, the value of ESOR 1225, calculated for the second nibble in table 1200, is 0000-1111-1111-1111 and the comparison between the SOR and the ESOR results in one SOR that differs from the ESOR, item 6, which is removed from the marker vector before starting on the third nibble. The value of ESOR 1325 of the third nibble in table 1300 is 0000-1111-1111-1111 and the comparison leads to the removal of item 3 from the marker vector before starting on the last nibble. ESOR 1425 of the last nibble in table 1400 is 0000-0000-0000-1111 which is equal to item 4 which appears to be the largest item in the dataset.

It may be appreciated that the size of the items in the dataset may be any size such as 4 bits, 8 bits, 12 bits, 16 bits and the like using bit aggregations of size 4, or 5 bits, 10 bits, 15 bits, 20 bits and the like using bit aggregations of size 5 and so on. The size of the SOR and the procedure for creating it may be adjusted to the actual size of bit aggregation. It may be appreciated that the computation time for the Min/Max operation described hereinabove may be proportional to the number of bit aggregations.

It may be appreciated that the same procedure, using the structure of the SOR defined hereinabove and a Boolean OR, may be employed to find a minimum value in a large dataset by creating SORs from the value of 15 minus the value of the nibble, instead of creating the SORs directly from the nibbles. In this case, the marker vector may hold an indication of the smallest items in the dataset. Alternatively, a lowest value may be found using the Boolean AND operation.

In an alternative embodiment of the present invention, using the same structure of the SOR, the largest value may be found using a combination of NOT and AND operations. The following Boolean operations may be used to find the maximum: a NOT operation on a result of an AND operation between all inverse (NOT) values of the bits in the row.

In an alternative embodiment, the structure of the SOR may be a continuous sequence of ones, followed by a continuous sequence of zeros. Using this structure, the maximum value may be found using a Boolean AND operation.

In another alternative of the present invention, the SOR may be represented by any other unary representation providing specific characteristics. One characteristic may be a unique representation of each number. Another characteristic may be that the bits having a specific value (for example "1") in a SOR of a smaller number are a subset of the bits having the same value in a SOR of the larger number, such that there is an overlap in the value of the bits in the larger and smaller numbers.

It may be appreciated that the structure of the SOR may determine the Boolean operation needed in order to find an extreme value. In some structures, using a Boolean OR may find the largest value while using a Boolean AND may find the lowest value, while using other structures, a Boolean OR may find the lowest value while using a Boolean AND may find the largest value and the like.

In an alternate embodiment of the present invention, the value of the SOR may be nulled, indicating items no longer being candidates.

In a preferred embodiment of the present invention, computation on different sections may be performed concurrently. In addition, the SOR creation may be performed concurrently with the horizontal bitwise OR between all bits j, providing an improved computation time.

In an alternative embodiment of the present invention, extreme finder 210 may find a minimum or maximum value in only a subset of the items of the dataset. In this case, flow 900 may receive a vector having only part of the items marked with the value "1", from which a minimum/maximum value should be found as an input vector. The initial values of "1" in the input vector may indicate the relevant initial candidates for being the minimum/maximum. While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method for finding an extreme value among a plurality of numbers in an associative memory, the method comprising:
    creating a spread-out representation (SOR) for each number of said plurality of numbers;
    storing each SOR in a column of said associative memory array; and
    performing a horizontal bit-wise Boolean operation on rows of said associative memory array to produce an extreme SOR (ESOR) having said extreme value.

2. The method of claim 1 wherein said SOR of a number N comprises a continuous sequence of zeros followed by a continuous sequence of K ones, wherein K=N+1.

3. The method of claim 1 wherein a SOR of a number having a value N comprises a continuous sequence of ones followed by a continuous sequence of K zeros, wherein K=N+1.

4. The method of claim 1 wherein said Boolean operation is one of: an OR operation and an AND operation.

5. The method of claim 1 wherein said number is a bit aggregation of a larger multi-bit-number.

6. The method of claim 5 wherein a first bit aggregation comprises most significant bits of said multi-bit number and a last bit aggregation comprises least significant bits of said multi-bit number.

7. The method of claim 5 wherein said multi-bit number represents an item from among a plurality of items.

8. The method of claim 7 wherein each of said items is assigned an initial candidacy indication.

9. The method of claim 8 wherein said creating a SOR is only for items having a candidacy indication.

10. The method of claim 9 also comprising:
    comparing said ESOR with each SOR of an item having a candidacy indication to provide a similarity indication which is one of: equal and unequal; and
    removing said candidacy indication from each number having an unequal similarity indication.

11. The method of claim 9 wherein each said larger multi-bit number has a multiplicity of bit aggregations and also comprising:
    repeating said creating, storing, performing, comparing and removing for each said bit aggregation of said multi-bit number until a last group aggregation, thereby to provide candidacy indications to said extreme numbers only.

12. A system for finding an extreme value amongst a plurality of numbers, the system comprising:
    an associative memory array storing said plurality of numbers, each number stored in a column;
    a spread-out representation (SOR) creator to create a SOR for each number of said plurality of numbers and to store each said SOR in a column of said associative memory array; and
    an extreme SOR (ESOR) finder to find an extreme value using a horizontal bit-wise Boolean operation on rows of said associative memory array storing bits of said SORs.

13. The system of claim 12 wherein said SOR of a number having the value N comprises one of: a continuous sequence of zeros followed by a continuous sequence of K ones, and a continuous sequence of ones followed by a continuous sequence of K zeros, wherein K=N+1.

14. The system of claim 13 wherein said Boolean operation is one of: an OR operation and an AND operation.

15. The system of claim 12 wherein said number is a bit aggregation of a larger multi-bit-number.

16. The system of claim 12 wherein a first bit aggregation comprises most significant bits of said multi-bit number and a last bit aggregation comprises least significant bits of said multi-bit number.

17. The system of claim 12 wherein said multi-bit number represents an item from among a plurality of items.

18. The system of claim 17 also comprising:
    a row of said memory array to store an initial candidacy indication for each item stored in a same column as each of said SORs; and
    an extreme finder to compare said ESOR with each SOR and to remove said candidacy indication from each SOR having a different value from said ESOR.

* * * * *